(12) United States Patent
Nishiguchi et al.

(10) Patent No.: US 7,772,133 B2
(45) Date of Patent: Aug. 10, 2010

(54) METHOD AND EQUIPMENT FOR FORMING OXIDE FILM

(75) Inventors: Tetsuya Nishiguchi, Shizuoka (JP); Shingo Ichimura, Ibaraki (JP); Hidehiko Nonaka, Ibaraki (JP); Yoshiki Morikawa, Shizuoka (JP); Takeshi Noyori, Shizuoka (JP); Mitsuru Kekura, Shizuoka (JP)

(73) Assignee: Meidensha Corporation, Tokyo (JP)

( * ) Notice: Subject to any disclaimer, the term of this patent is extended or adjusted under 35 U.S.C. 154(b) by 610 days.

(21) Appl. No.: 11/659,728

(22) PCT Filed: Aug. 1, 2005

(86) PCT No.: PCT/JP2005/014054
§ 371 (c)(1),
(2), (4) Date: Feb. 8, 2007

(87) PCT Pub. No.: WO2006/016496
PCT Pub. Date: Feb. 16, 2006

(65) Prior Publication Data
US 2007/0218203 A1    Sep. 20, 2007

(30) Foreign Application Priority Data
Aug. 11, 2004   (JP)   .............. 2004-234754
Nov. 10, 2004   (JP)   .............. 2004-326760

(51) Int. Cl.
*H01L 21/469*   (2006.01)
*H01L 21/31*    (2006.01)
(52) U.S. Cl. .............. 438/790; 257/E21.271; 257/E21.274; 257/E21.278; 438/787
(58) Field of Classification Search .......... 257/E21.271, 257/E21.274, E21.278; 438/787, 790
See application file for complete search history.

(56) References Cited

U.S. PATENT DOCUMENTS
6,191,046 B1 *   2/2001   Singh et al. .......... 438/723
(Continued)

FOREIGN PATENT DOCUMENTS
JP       5-259155 A       10/1993
(Continued)

OTHER PUBLICATIONS

R. Rashid et al., "Physical and Electrical Properties of Low Temperature (<100° C) $SiO_2$ Films Deposited by Electron Cyclotron Resonance Plasmas", J. Vac. Sci. Technol., A 21(3), May/Jun. 2003, pp. 728-739.

(Continued)

*Primary Examiner*—Asok K Sarkar
(74) *Attorney, Agent, or Firm*—Foley Lardner LLP

(57) ABSTRACT

An oxide film forming equipment is provided with a reactor 10 in which a heater unit 14 holding a substrate 100 is stored, a piping 11 provided with a material gas introducing valve V1 for introducing a material gas containing organic silicon or organic metal into the reactor, a piping 12 provided with an ozone containing gas introducing valve V2 for introducing an ozone containing gas into the reactor 10, and a piping 13 provided with an exhaustion valve 13 for exhausting a gas in the reactor 10. When the material gas introducing valve V1, the ozone containing gas introducing valve V2, and the exhaustion valve V3 perform open-and-closure operations to alternately supply the material gas and the ozone containing gas into the reactor 10, the ozone containing gas introducing valve V2 operates to fall an ozone concentration of the ozone containing gas in a range from 0.1 vol % to 100 vol % and the heater unit adjusts a temperature of the substrate from a room temperature to 400° C.

11 Claims, 7 Drawing Sheets

U.S. PATENT DOCUMENTS

| | | | |
|---|---|---|---|
| 6,531,412 B2 * | 3/2003 | Conti et al. | 438/778 |
| 7,214,412 B2 | 5/2007 | Nishiguchi et al. | |
| 2003/0138562 A1 * | 7/2003 | Subramony et al. | 427/255.28 |
| 2004/0053472 A1 | 3/2004 | Kiryu et al. | |
| 2006/0258174 A1 | 11/2006 | Sakai et al. | |

FOREIGN PATENT DOCUMENTS

| | | |
|---|---|---|
| JP | 8-031814 A | 2/1996 |
| JP | 8-031815 A | 2/1996 |
| JP | 2004-137101 A | 5/2004 |
| JP | 2004-193280 A | 7/2004 |
| JP | 2005-064538 A | 3/2005 |
| JP | 2005-197561 A | 7/2005 |
| WO | WO 02/23614 A1 | 3/2002 |
| WO | WO 2005/017987 A1 | 2/2005 |

OTHER PUBLICATIONS

A.M. Nguyen et al., "Properties of Chemical Vapor Deposited Tetraethylorthosilicate Oxides: Correlation with Deposition Parameters, Annealing, and Hydrogen Concentration," J. Vac. Sci. Technol., B 8(3), May/Jun. 1990, pp. 533-539.

T. Yoshie, et al., "A Study of Growth Mechanism in TEOS-$O_3$ APCVD $SiO_2$," The Institute of Electronics, Information and Communication Engineers, SDM94-150, (Nov. 1994), pp. 71-77.

* cited by examiner

METHOD AND EQUIPMENT FOR FORMING OXIDE FILM

TECHNICAL FIELD

The present invention relates to a technique to prepare an insulating film at a low temperature with a high quality which is a heart of a device having a restriction on a process temperature from a heat-resistant temperature of a substrate temperature such as a thin film transistor (TFT), a silicon device on an organic substrate, and so forth.

BACKGROUND ART

In recent years, an LCD device of a TFT system has widely been used as a display device. The LCD device has a glass substrate on which the TFT (thin film transistor) is formed in a matrix shape, this TFT driving the liquid crystal in a vertical direction of the TFT. The TFT is formed with an insulating film or a polysilicon film laminated on the glass substrate. As the glass substrate, a soda glass cheaper than a quartz glass has been used. The soda glass has a low softening point of about 500° C. as compared with the quartz glass. In addition, Na included in the soda glass is diffused at a high temperature environment. Thus, a film forming technique at 400° C. or lower has been demanded. In addition, a film quality of a film thus generated is demanded having a high quality closely to that of the film formed at a higher temperature. In addition, in recent years, as represented by a flexible information terminal (flexible PC, cellular phone), a silicon device preparing technique on an organic (flexible) substrate such as plastics (polyimide) or so forth becomes important. In this case, the process temperature is 250° C. or lower, as viewed from the heat-resistant temperature of polyimide and so forth.

As these insulating films, silicon oxide films are mainly used. A film forming method mainly includes a technique in which an $SiO_2$ film is deposited on a polysilicon (for example, a film thickness is 50 nm) prepared on a glass (or an organic material) through a thermal CVD or a plasma CVD. In a case of the thermal CVD, $SiH_4+O_2$ is mainly used. It is, however, noted that many problems such that the insulating film prepared at 300° C. or lower contains a large quantity of impurities or moisture, has a low compactness, has many pinholes and particles, and has a low insulating withstanding voltage and many leak currents are raised.

Then, to solve these problems, the plasma CVD method is used. For example, according to non-patent literature 1 (J. Vac. Sci. Technol. A21, 728 (2003)), the preparation of the insulating film having a good quality of the insulating withstanding voltage of 4 MV/cm, an interface level density of $10^{12}$ [$eV^{-1}$ $cm^{-2}$], and a stationary electric charge density of $10^{11}$ [$cm^{-2}$] at a substrate temperature of 100° C. has succeeded through the CVD using $SiH_4+O_2$ gas within an ECR (Electron Cyclotron Resonance) plasma reaction furnace.

However, if a plasma CVD method is used, the following problem occurs. Due to a plasma reaction in a gaseous phase, many particles are found, a step coverage is low, a process window (a film forming temperature, a gas pressure, and an opposing inter-electrode distance, and so forth) to realize an ideal film density (2.2 g/cm³) and a composition (Si:O=1:2) is narrow. Due to the presence of many particles, it is necessary to clarify a film forming chamber frequently.

To relieve the problem described hereinabove, as the film forming method which can use a high safety reaction gas, can set easily the film forming condition, and can suppress the development of the particles easily, a thermal CVD process under a mixture gas including an organic silicon material (easier in handling than $SiH_4$) having Si—O bond and Si—H bond and ozone has been proposed. A high oxidizing ability of ozone gas to the organic material is utilized.

According to patent literature 1 (Japanese Publication Patent Application (tokkai) No. Heisei 8-31815), the deposition of $SiO_2$ film having a favorable step coverage at 400° C. due to the thermal CVD under an atmospheric pressure using TMS (Trimethoxysilane), TES (Triethoxysilane), TEOS (Tetraethylorthosilicate), and the ozone gas has succeeded. It is noted that, ozone is a gas having the thermal decomposition and a concentration of the ozone gas gives a large effect on the film quality. Hence, by using nitrogen as a carrier gas and diluting ozone gas to a sufficiently low concentration at which the ozone gas can stably be present, an effective supply of ozone gas, a uniform development of CVD reaction at the proximity of the substrate surface and a uniform film deposition are realized.

On the other hand, according to patent literature 2 (Japanese Publication Patent Application (tokkai) No. Heisei 5-259155), it is known that, as the concentration of the ozone gas used becomes higher, the concentration of impurities such as hydrocarbon present in the film becomes lower so that a moisture absorption resistant characteristic becomes favorable, an insulating characteristic becomes favorable, and a leak current becomes small. That is to say, in a case where the ozone gas is used, there is a trade-off relationship between a uniformity in CVD film (film thickness and film quality) and a high quality of the film. Although utilizing a high organic material utilizing a high oxidizing ability of the ozone gas to organic material, a process in which reactivity is controlled using the high concentration ozone gas is not yet architected.

Furthermore, at a low temperature process equal to or lower than 300° C., even in the CVD using an ozone containing gas, a contamination of C-series organic material and water (and hydrogen or OH) into the film due to byproducts formed by the decomposition at the gaseous phase of the organic material gas cannot perfectly be eliminated. For example, as reported in non-patent literature 2 (J. Vac. Sci. Technol. B8, 533 (1990)), As-deposited film is porous as suggested from the fact that the film after the deposition in a buffered hydrofluoric acid solution indicates an etching speed faster than a thermal oxide film by ten times or more. If RTA (Rapid Thermal Annealing) after the deposition is performed, a high density of the film can be achieved (appearing as a reduction of the etching speed of film). However, it is necessary to heat the film at about 1000° C. to obtain a high density film approximate to the thermal oxide film. This high temperature heating process cannot be used in the film forming process on the glass or organic substrate as described above.

Non-patent literature 1: J. Vac. Sci. Technol. A21, 728 (2003)

Patent literature 1: Japanese Publication Patent Application No. Heisei 8-31815

Patent literature 2: Japanese Publication Patent Application No. Heisei 5-259155

Non-patent literature 2: J. Vac. Sci. Technol. B8, 533 (1990)

DISCLOSURE OF THE INVENTION

It is, in view of the above-described circumstances, an object of the present invention to provide an oxide film forming method and equipment which can prepare a uniform and high-quality insulating film, while effectively making use of the organic material decomposition power of the high concentration ozone gas and, especially, can prepare the high-quality insulating film only through a low temperature process equal to or lower than 300° C.

The oxide film forming method and equipment according to the present invention can form a good-quality silicon oxide film ($SiO_2$ film) by supplying a material gas containing organic silicon or organic metal and an ozone containing gas alternately to the substrate to cause a CVD reaction thereon and can prepare the high-quality insulating film even only at the low temperature process equal to or lower than 300° C.

The oxide film forming method according to the present invention is a silicon oxide film forming method in which a silicon oxide film is formed on a surface of the substrate by supplying the material gas containing the organic silicon having a Si (silicon)-O (oxygen) bond or Si (silicon)-C (carbon) bond or the organic metal having a metal element—oxygen bond or a metal element—carbon bond and the ozone containing gas alternately to the substrate. In this method, the substrate temperature is adjusted in a range from a room temperature to 400° C. and the ozone concentration of the ozone containing gas is adjusted in a range from 0.1 vol % to 100 vol %.

In addition, the oxide film forming equipment according to the present invention, wherein the material gas containing the organic silicon having Si (silicon)-O (oxygen) bond or Si (silicon)-C(carbon) bond or the organic metal having a metal element-oxygen bond or a metal element-carbon bond and the ozone containing gas are alternately supplied to the substrate to form the oxide film on a surface of the substrate, comprises: a reactor configured to store a heater unit for holding the substrate; a piping provided with a material gas introducing valve for introducing the material gas into the reactor; another piping provided with an ozone containing gas introducing valve for introducing the ozone containing gas into the reactor; and a still another piping provided with an exhaustion valve for exhausting gas within the reactor, when the material gas introducing valve, the ozone containing gas introducing valve, and the exhaustion valve perform open-and-closure operations to alternately supply the material gas and the ozone containing gas within the reactor, the ozone containing gas introducing valve adjusting an ozone concentration of the ozone containing gas in a range from 0.1 vol % to 100 vol % and the heater unit adjusting a temperature of the substrate in a range from a room temperature to 400° C.

In the oxide film forming method described above, the open-and-closure operations of the material gas introducing valve and exhaustion valve may be controlled in order for an introduction pressure of the material gas at a cycle of supplying alternately the material gas and the ozone containing gas to be in a range from 0.1 Pa to 100 Pa in a case where a single silicon atom is included in the material gas and may have an upper limit which is 1/n the above-described pressure range in a case where n number of silicon atoms are included in the material gas.

At this time, in the oxide film forming equipment described above, for example, open-and-closure operations of the material gas introducing valve and exhaustion valve may be controlled in order for an introduction pressure of the material gas at a cycle of supplying alternately the material gas and the ozone containing gas to be in a range from 0.1 Pa to 100 Pa in a case where a single silicon atom is included in the material gas and may have an upper limit which is 1/n the above-described pressure range in a case where n number of silicon atoms are included in the material gas.

In addition, in the oxide film forming method described above, the ozone containing gas to the material gas may be supplied by a quantity corresponding to a chemical equivalent to oxidize the organic silicon or the organic metal at least included in the material gas all to a silicon oxide or a metal oxide. At this time, in the oxide film forming equipment described above, the open-and-closure operation of the ozone gas introducing valve may be controlled to supply the ozone containing gas by the quantity corresponding to the chemical equivalent to oxidize the organic silicon included at least in the material gas all to a silicon oxide.

More specifically, in the oxide film forming method described above, the supply quantity of the ozone containing gas may be set to a quantity to a degree that a pressure rise due to a thermal decomposition of ozone resided in a closed reaction system of the substrate, the material gas, and the ozone containing gas after the supply of the ozone containing gas can be confirmed. At this time, in the oxide film forming equipment described above, for example, the open-and-closure operation of the ozone containing gas introducing valve may be controlled in order for the supply quantity of the ozone containing gas to be set to a quantity to a degree that the pressure rise due to the thermal decomposition of ozone resided in the closed reaction system of the substrate, the material gas, and the ozone containing gas after the ozone containing gas is supplied can be confirmed.

In other words, an exposure quantity of the ozone containing gas may be introduced at a ratio required to oxidize the organic silicon or the organic metal, which is expected at least in chemical reaction formulae to form the silicon oxide or the metal oxide, thus all being oxidized to $CO_2$ and $H_2O$. Ideally, a quantity of supply of the ozone containing gas is such that the pressure rise due to the thermal decomposition of an extra ozone after the reaction in a case where the reaction system is closed after the supply of the ozone containing gas can be confirmed.

In addition, in the oxide film forming method described above, in each cycle of supplying alternately the material gas and the ozone containing gas, a film forming speed per cycle may become lower as the substrate temperature becomes lower. At this time, in the oxide film forming equipment described above, for example, in each cycle of supplying alternately the material gas and the ozone containing gas, the open-and-closure operations of the material gas introducing valve, the ozone containing gas introducing valve, and the exhaustion valve may be controlled for the film forming speed per cycle to become lower as the substrate temperature becomes lower.

In the oxide film forming method and equipment, the film forming speed may be in a range from 0.2 nm/cycle to 1.0 nm/cycle at the substrate temperature of 200° C. In addition, the film forming speed may be in a range from 0.2 nm/cycle to 5.0 nm/cycle at the substrate temperature of 300° C. It is noted that, as will be described later, during a use of an ultraviolet light, the film forming speed can be raised to be equal to or higher than theses values in a case where the substrate temperature is instantaneously raised to a value equal to or higher than these substrate temperature values when an instantaneous heat is applied only during the supply of ozone. However, the film forming speed is dependent upon a luminance of the ultraviolet light and an instantaneous temperature.

In addition, in the oxide film forming method described above, the ultraviolet light may be irradiated on the substrate when the material gas and the ozone containing gas are alternately supplied.

At this time, in the oxide film forming equipment described above, the reactor may, for example, be equipped with a light source for irradiating the ultraviolet light on the substrate and an ultraviolet light irradiation window through which the irradiated ultraviolet light is transmitted. A material of the ultraviolet light irradiation window may be a known material if the ultraviolet light is transmitted therethrough.

In addition, in the oxide film forming method described above, a reactor in which the oxide film is formed on the surface of the substrate by the alternate supplies of the material gas and the ozone containing gas while the ultraviolet light is irradiated on the substrate may be provided and a distance from the ultraviolet light irradiation window installed in the reactor to the substrate may be adjusted to be shorter than an absorption depth (a distance corresponding to 1/e an incident light intensity) of the introduced ultraviolet light absorbed by an ozone partial pressure.

At this time, in the oxide film forming equipment, the heater unit which can arbitrarily adjust a position of the substrate may be provided, the heater unit being used to adjust the position of the substrate in order for the distance from the ultraviolet light irradiation light window to the substrate to be shorter than the absorption depth (the distance corresponding to 1/e incident light intensity) of the introduced ultraviolet light absorbed through an ozone partial pressure. The heater unit may be a known heater unit that can adjust arbitrarily the position of the substrate.

In addition, a low pressure cold wall type reactor or a hot wall type reactor may be adopted as the reactor used in the oxide film forming method and equipment described hereinabove.

In addition, since, in the oxide film forming method and equipment according to the present invention described hereinabove, the ozone containing gas and the material gas are not simultaneously supplied, namely, since the oxide film forming method and equipment according to the present invention is a type in which the ozone containing gas is introduced to the material gas under a very low pressure (molecular density) present in the reactor, a high concentration ozone gas (for example, 100% ozone) having an extremely high reactivity to the organic material can be used as an oxidizing agent without consideration of a danger as the oxidizing agent.

In addition, since the material gas is uniformly filled spatially and, thereafter, a sufficient quantity of the ozone containing gas to perfectly oxidize the material gas is filled, a high uniformity treatment of a large-sized substrate can be achieved. Although, in a case where the substrate is treated by a flow of gas, a fluctuation of a spatial processing caused by the gas flow (due to a spatial fluctuation of molecular densities of the material gas and ozone gas) cannot be avoided if the process is carried out at a pressure region of a viscous flow. However, such a problem as described above does not occur in the oxide film forming method and equipment according to the present invention.

Furthermore, the alternate supply method of the material gas and the ozone containing gas in the present invention permits a thickening of a deposited film per cycle as compared with an ALD (Atomic Layer Deposition) method (a method in which material gas molecules absorbed on a surface are reformed by the subsequent gas supply, a thin film of one atomic layer is deposited, and this process is repeated cyclically) which is one of important techniques in a recent-year thin-film, high-degree control method and a large-area deposition method. Hence, the number of times the repeated supplies are carried out to obtain a constant film thickness of the oxide film can be reduced and it becomes possible to reduce the film forming time duration and to increase the throughput. Especially, when the material gas and the ozone containing gas are supplied alternately, the ultraviolet light is irradiated on the substrate. Thus, a faster film forming speed per cycle can be achieved.

In addition, since the ozone containing gas has a high reactivity, the process time per cycle can be shortened as compared with $H_2O$ sometimes used as the oxidizing agent of the ALD process up to now. That is to say, since ozone which is a dry gas is used, a vapor pressure of water left within the reactor upon an end of the reaction is low and a gas which is difficult to be exhausted by a dry pump is not resided in the reactor so that an exhaustion can become fast.

Furthermore, since a utilization efficiency of ozone gas is improved and a use quantity of ozone gas is reduced, a load on an exhaust system can be reduced. In the manufacture of ozone gas, a discharge mainly using a high-frequency power supply is ordinarily used. It is desirable to use ozone gas as a minimum requirement in terms of an environment load (an electric power is needed in the manufacture of ozone gas). The silicon oxide film forming method and equipment according to the present invention satisfies the above standpoint.

In addition, in the oxide film forming method and equipment according to the present invention, the substrate temperature is set to be a room temperature when the material gas is supplied and a processing temperature is set pulsatively to conform to a timing of the supply of ozone gas. Thus, it becomes possible for all temperatures within the reaction system to be constant at the room temperature. A uniform (material gas and ozone containing gas) concentration distribution is easy to be achieved and, thereby, a uniform process can be achieved. In this case, a high temperature can instantaneously be applied to the substrate as compared with a case where the substrate is continuously heated. Thus, the diffusion distance of ozone is not only increased (namely, the formed film thickness per cycle can be increased) but also hydrogen and water-series impurities which are easy to be left in the oxide film can effectively be eliminated.

Hence, according to the oxide film forming method and equipment in the present invention, a uniform and high-quality insulating film can be prepared while effectively exerting the organic material decomposition power of a high-concentration ozone gas. Consequently, the high-quality insulating film can be prepared only through the low temperature process equal to or below 300° C.

In addition, in the oxide film forming method and equipment according to the present invention, in a case where the substrate is made of a polysilicon-series material, the ozone containing gas may be supplied at a constant flow quantity and for a constant time to the substrate under a constant substrate temperature before the alternate supplies of the material gas and the ozone containing gas to the substrate to form a thermal oxide film on the substrate. Thus, a more uniform and high-quality (a high-density) thermal oxide film with a high-density film thickness may be grown up even at a low temperature. That is to say, an ozone thermal oxidation is carried out so that a substrate surface state can more uniformly be controlled.

Furthermore, if the ultraviolet light is irradiated on the substrate when the thermal oxide film is formed, a better-quality thermal oxide film having a sufficient film thickness (for example, 3 nm) even under a low temperature (for example, the room temperature) can be formed in a short time.

As described hereinabove, according to the oxide film forming method and equipment according to the present invention, uniform and high-quality insulating film can be prepared, especially, the high-quality insulating film can be formed only at the low temperature process equal to or lower than 300° C.

BEST MODE FOR CARRYING OUT THE INVENTION

Preferred embodiments according to the present invention will, hereinafter, be described with reference to the drawings.

First Embodiment

Figure 1:
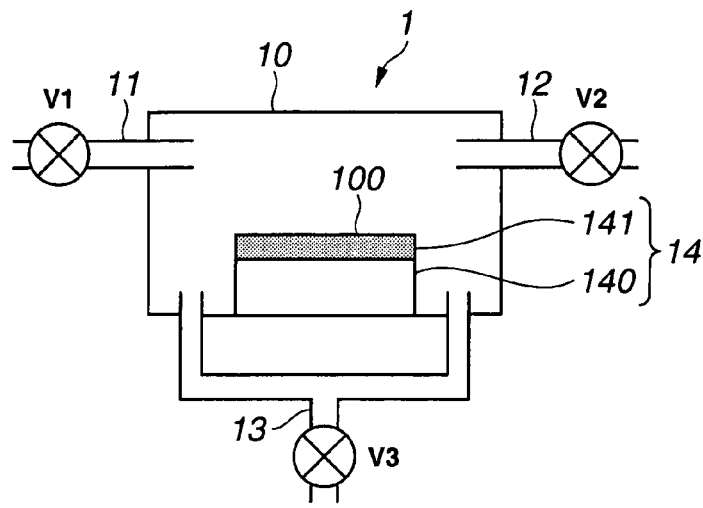
FIG. 1 is a schematic configuration view representing a first preferred embodiment according to the present invention.
Figure 2:
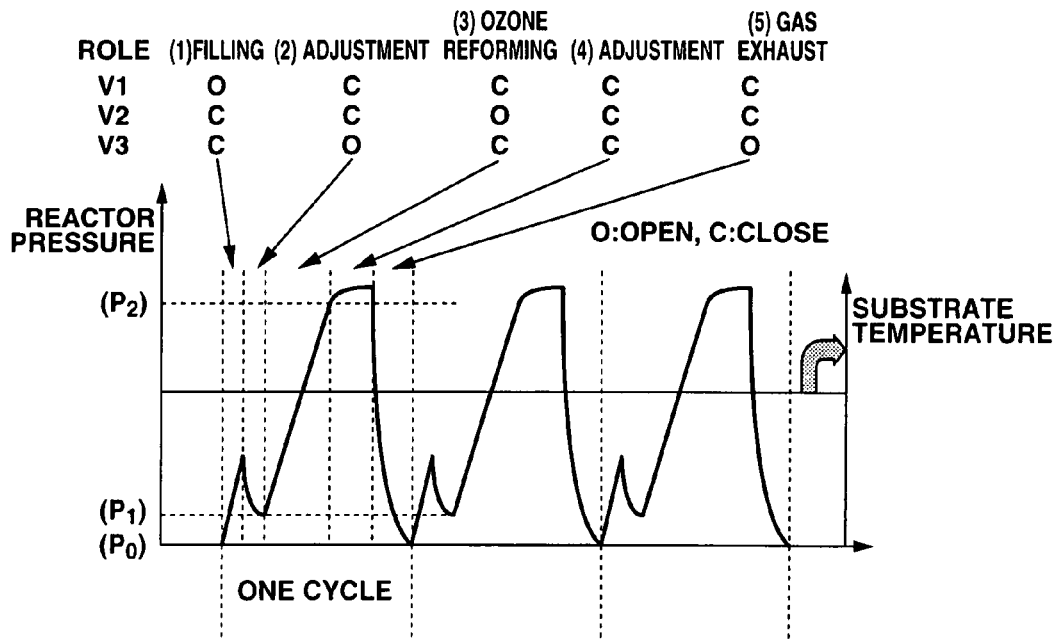
FIG. 2 is a process flow diagram related to the first preferred embodiment.

FIG. 1 is a rough configuration view of an oxide film forming equipment in a first preferred embodiment. In addition, FIG. 2 shows a process flow related to the first preferred embodiment.

Oxide film forming equipment 1 in this embodiment includes: a reactor 10 in which a heater unit 14 holding a substrate 100 is stored; a piping 11 in which a material gas introduction valve V1 for introducing a material gas within reactor 10 is provided; a piping 12 in which an ozone containing gas introduction valve V2 for introducing ozone containing gas into reactor 10 is provided; and a piping 13 in which an exhaustion valve V3 for exhausting gas within reactor 10 is provided. Then, open-and-closure operations of material gas introducing valve V1, ozone containing gas introduction valve V2, and exhaustion valve V3 are controlled. Thus, the silicon oxide film is formed on the surface of substrate 100 by supplying the material gas and the ozone containing gas alternately within reactor 10.

As reactor 10, a low-pressure (reaction furnace adopting) cold wall type which can heat only substrate 100 may be adopted. An exhaust pump (not shown) is connected to piping 13 to heat only substrate 100. In addition, an installation form of substrate 100 in reactor 10 may adopt a known longitudinal type or lateral type. It is noted that a material quality of reactor 10 may be adopted which has no reactivity to ozone. For example, quartz, stainless steel, aluminum, titanium, and so forth are enumerated.

Material gas may be an organic substance having Si—C bond or Si—O bond. For example, TEOS (Tetraethylorthosilicate), HMDS (Hexamethyldislazane), and so forth are enumerated.

The heating of substrate 100 by means of heater unit 14 is a system in which substrate 100 is held on a heater stage 140 using a heat generator 141 as shown in FIG. 1. In addition to this, the heating of substrate 100 may adopt a conventionally adopted well known heating means in which a halogen lamp is irradiated on an ultra-red absorption stage holding the substrate (for example, made of a sintered SiC).

For the exhaustion of gas within reactor 10, a system used on a conventional CVD furnace may directly be used. At this time, a device to eliminate harmful component such as a particle trap and a dry pump having an ultimate vacuum equal to or below about 1 Pa, for example, a mechanical booster pump (for example, an exhaust speed of 1000 l/min) is needed.

FIG. 2 shows a process flow for forming the silicon oxide film.

The procedure shown includes steps of one cycle (for example, 1 to 10 seconds) of (1) filling of the material gas, (2) adjustment of the pressure within the reactor, (3) ozone introduction of ozone gas, (4) adjustment of the pressure within the reactor, and (5) gas exhaustion. FIG. 2 shows an open-and-closure operation (O: Open, C: (Close) of each valve (V1, V2, and V3) at each step. It is noted that, in FIG. 2, ($P_0$) means a back pressure (for example, 1 Pa), ($P_1$) means a material gas filling pressure, and ($P_2$) means a pressure after the ozone introduction.

A general outline of the above-described open-and-closure operation of each valve will be explained below.

1) First, valve (V1) is opened to supply the material gas so that the material gas is filled within reactor 10 under a constant pressure (for example, 10 Pa) which is higher than the exhaust ultimate pressure.

2) In this case, since, depending upon the material gas, a vapor pressure at a room temperature (a cold wall temperature and a temperature of gaseous phase sufficiently apart from the heated surface) is high (for example, in a case of TMS (Tetramethylsilane), 600 Torr at 20° C.), the exhaustion of gas is carried out until the pressure within the reactor becomes the above-described pressure. The introduction of the material gas at this time may be carried out through the introduction from a side surface of the reactor or over a shower head of the reactor (in addition, a vertical furnace or horizontal furnace may be adopted). On the contrary, in a case where the vapor pressure of the material gas is lower than the filling pressure (for example, 10 Pa), the temperatures of OMTS (Octamethylcyclotetrasiloxane), a supply piping system, and the whole reactor are heated to become equal to the filling pressure. A life of ozone equal to or below 100° C. is sufficiently long as will be described below so that a furnace of the hot wall type (an electric furnace) may be adopted.

3) Next, the ozone containing gas is introduced into a system (processing reactor 10). The introduction of the ozone containing gas is carried out at a constant flow quantity such as a mass flow. Or alternatively, the open-and-closure operation of the valve (V2) may be adjusted in order for the pressure rise in the system to become constant. At this time, according to its necessity, a soft start function is provided on ozone containing gas introduction valve (v2) so that an abrupt gas introduction or accompanied particle generations, and contamination of the particles into silicon oxide film can be prevented. In addition, with a physical distance from the wall maintained, a powder contamination into substrate 100 can be avoided.

Ozone concentration of ozone containing gas ranges from 0.1% to 100%. Gas manufactured by a general industrial ozone generator and a high-concentration ozone gas in which oxygen gas is eliminated from this oxygen ozone gas mixture can be used.

A required introduction ozone partial pressure is different according to organic material gas used. In general, the material gas is perfectly oxidized to $CO_2$ and $H_2O$. Furthermore, silicon is filled by a quantity equal to or larger than a quantity required to reform silicon into a perfect oxidation state ($SiO_2$) through extra oxygen atoms. For example, in a case where, for example, TEOS gas is used, as appreciated from the following chemical formulae, a film in a state in which silicon is perfectly oxidized is prepared at eight times pressure (an amount of a substance) of TEOS. Simultaneously, the organic material can be exhausted from a substrate surface deposition film in a state of $CO_2$ and $H_2O$. In the same way, in a case of TMS, 5.33 times pressure may be accepted.

In the case of TEOS:

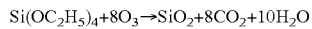

$$Si(OC_2H_5)_4 + 8O_3 \rightarrow SiO_2 + 8CO_2 + 10H_2O$$

In the case of TMS:

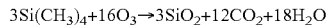

$$3Si(CH_3)_4 + 16O_3 \rightarrow 3SiO_2 + 12CO_2 + 18H_2O$$

It is, however, noted that, in a case where the substrate temperature is equal to or higher than the room temperature, for example, 300° C., since a thermal decomposition occurs before ozone has arrived at the surface of the substrate due to a heat radiation perceived from the substrate and, consequently, the CVD reaction in the gaseous phase is resulted in and not resulted in the CVD reaction on the substrate surface (a promotion of a surface reaction permits a base material dependency such that convex and recess portions appear on a surface profile of a grown film due to a material quality of the base material and a surface state and a growth speed of the film is varied to be eliminated (refer to a Japanese Publication Patent Application (tokkai) No. Heisei 8-031814), it is necessary to introduce the ozone gas having a quantity equal to or larger than the above-described quantity. The life of ozone gas in the gaseous phase was calculated utilizing reaction rate constant of the thermal decomposition of ozone.

Figure 3:
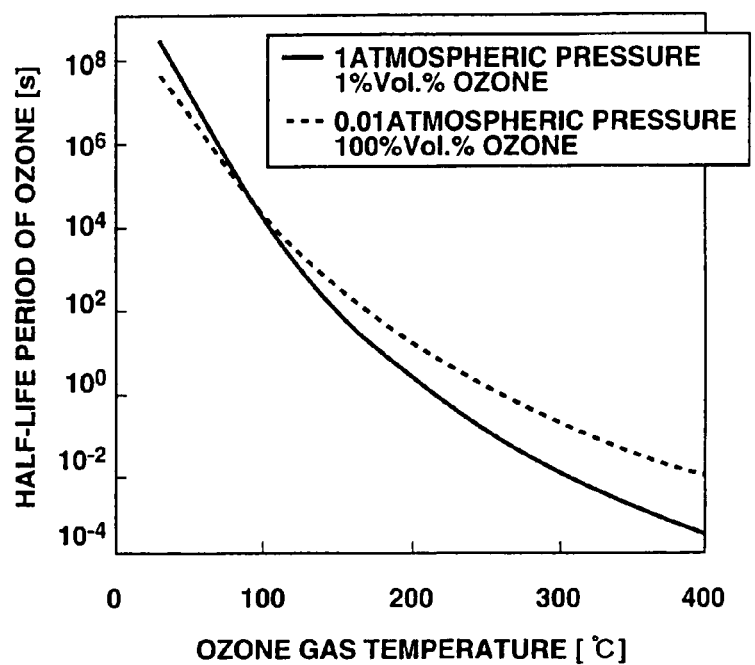
FIG. 3 is a characteristic graph representing a lifetime of ozone gas in a gaseous phase.

FIG. 3 shows a characteristic graph representing a life of ozone gas in the gaseous phase. The life of ozone within a boundary layer (a region in which the gas temperature is 300° C.) on the surface of the substrate whose temperature is 300° C. indicates 0.1 seconds and 0.01 seconds under 0.01 atmospheric pressure and 100 vol % ozone atmosphere and under 1 atmospheric pressure 1 vol % ozone atmosphere (99 vol % oxygen atmosphere) respectively. In this way, the ozone gas is thermally decomposed at a shorter time than a filling time of the ozone containing gas within the reactor, representatively, 1 second or 10 seconds. That is to say, the ozone gas does not arrive at the substrate surface and a transport becomes rate-controlling factor.

In a case where the life of ozone gas in gaseous phase is short at a position in the proximity of the substrate surface as compared with ozone gas supply time (for example, a case where the substrate temperature is 250° C. or higher when the system pressure is 0.1 atmospheric pressure using ozone gas of 100% concentration), it is necessary to introduce an extra ozone gas than the above. The ozone containing gas quantity is sufficient or not can be determined from whether a pressure within the reactor is raised in a case where the furnace is sealed after the end of the supply of ozone gas. That is to say, as shown in FIG. 2, if the extra ozone after the reaction is present after the reaction of the organic silicon gas with the ozone containing gas, a rise in pressure due to the thermal decomposition of ozone gas on the high-temperature substrate surface.

No special restriction is placed on a supply method of ozone gas. Either a vertical type flow from an upper portion of the substrate over the shower head or a horizontal type supply in a direction parallel to the substrate may be accepted, provided that the ozone gas partial pressure is sufficient as compared with a quantity required to react with the material gas. In a case of a lack in uniformity of the film, a mechanism to improve the uniformity of the CVD film on the basis of a conventional method such as a rotation of the substrate may be used together with either the vertical type flow or the horizontal supply.

A mass spectroscopy was used as follows to evaluate a reactivity of the material gas and the ozone gas in the gaseous phase at the room temperature and an ozone gas quantity required for the material gas quantity.

(Experiment method) Variations of a mass spectrum (a gas composition in gaseous phase) before and after the ozone gas having a pressure of 2700 Pa (nine times the material gas) is introduced into a chamber (a Maiba single wafer processing type) filled with the silicon material gas having a pressure of 300 Pa were compared with the case where oxygen gas whose quantity is the same (2700 Pa). A measurement condition was that the gas having a total pressure of $10^{-2}$ Pa was sampled and introduced in a mass analysis evaluation chamber.

In a case where the material gas was TEOS, when the ozone gas whose partial pressure was nine times higher than the material gas was introduced, the ozone gas was almost perfectly decomposed and mass members $m/e^+=18$, $m/e^+=28$, $m/e^+=32$, $m/e^+=44$ (respectively correspond to $H_2O$, CO or SiO, $O_2$, and $CO_2$) become main components of gas. On the other hand, in a case where the oxygen gas was introduced into the chamber, the decompositions to these low molecular number components do not occur.

Figure 5:
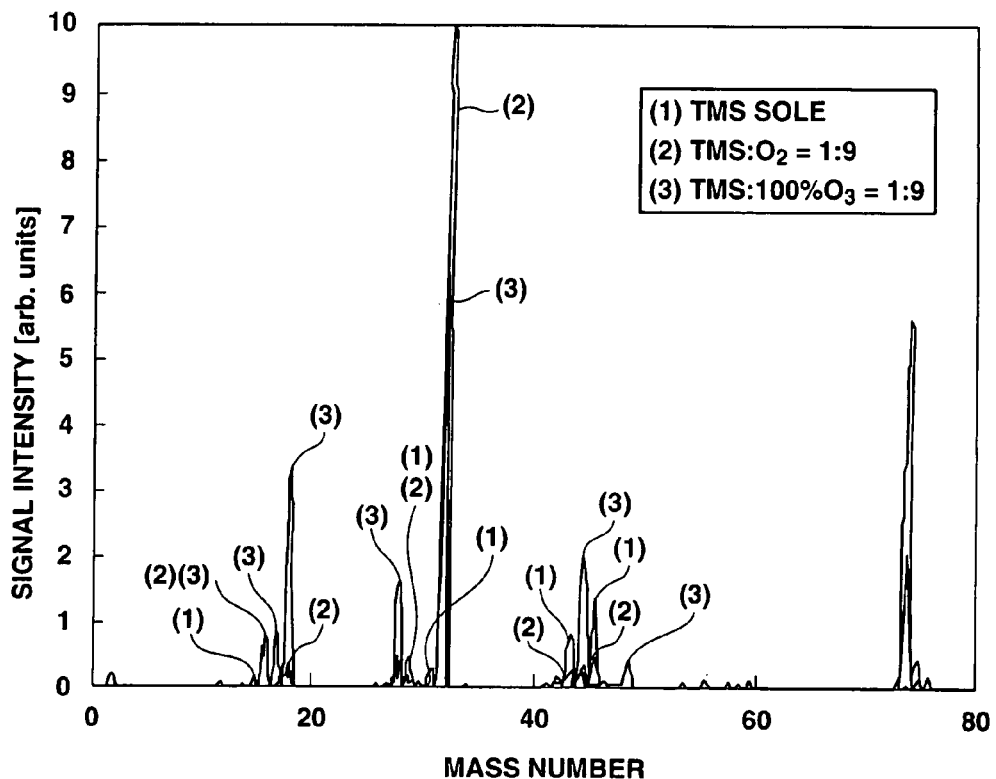
FIG. 5 is a graph of gas composition after ozone gas of 2700 Pa and oxygen gas of 2700 Pa are introduced under TMS 300 Pa atmosphere.

In the case of TMS, the same tendency as the composition evaluation shown in FIG. 5 is provided. It is, however, noted that, since, in the case of TMS, the introduction of ozone gas having a nine times amount of a substance is excessive in ozone gas, it can be confirmed that ozone gas is extra in the gaseous phase (an outbreak of a signal of mass number 48).

Figure 6:
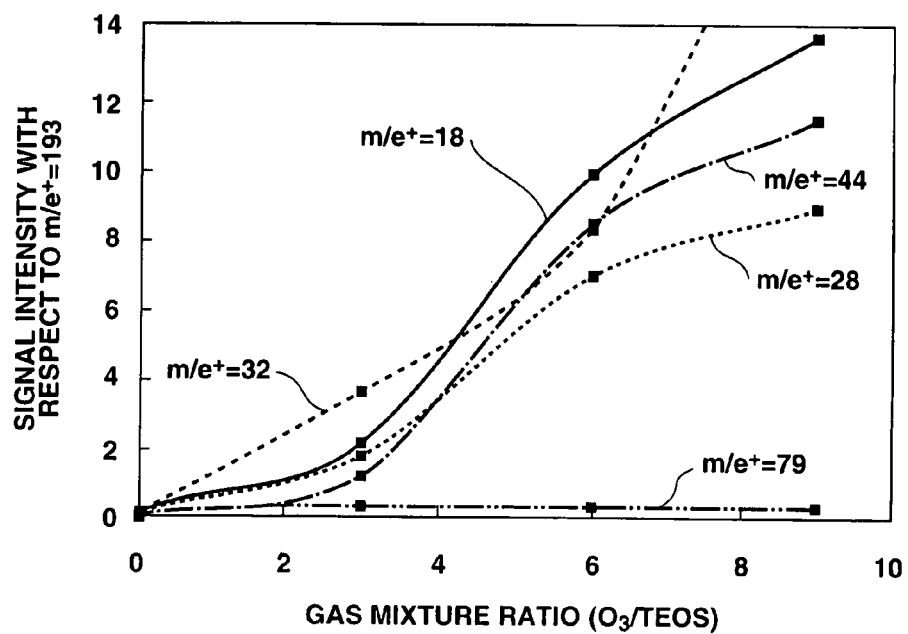
FIG. 6 is a graph of gas composition an effect of a gas mixture ratio, especially representing an ozone gas introduction dependency of ozone gas of each mass number signal intensity with respect to a signal of mass number 193 that corresponds to a quantity of a raw material of TEOS gas.

In this connection, in a case of TEOS, it was found that the decomposition was insufficient for the introduction of ozone gas of three times and six times amount of substance. That is to say, in the case of TEOS, when a quantity of introduction of ozone gas was increased by three times, six times, and nine times with respect to a pressure of TEOS under a TEOS material gas atmosphere of a constant gas pressure, it was found that as the characteristic graph shown in FIG. 6, generated $H_2O$, CO(SiO), $O_2$, $CO_2$ were increased. That is to say, it was appreciated that more efficient and more perfect organic material decomposition reaction is advancing.

In a case where the system (the reactor) is once sealed in after the gas introduction, the presence of the pressure rise suggests the extra ozone gas within the system if the ozone gas is extra within the system. If the ozone gas quantity becomes deficient, the film quality is reduced as will be described below. Thus, it is desirable to set a condition such that the pressure rise of the system can always be confirmed after the end of the ozone gas introduction.

Next, concerning an introduction gas quantity ratio between the ozone gas and the material gas, a range of an introduction pressure of the material gas per each cycle is quantified as a condition that a sufficient decomposition of the material gas at the determined gaseous phase can be made.

That is to say, it is expected that, as the material gas pressure becomes higher, the film thickness (namely, the film thickness deposited at one cycle) made after the subsequent ozone supply becomes thicker. However, since the gas pressure introduced within the reactor is high, it is expected that a controllability of a chemical reaction of the material gas and the ozone gas an impurity quantity taken in when the film is deposited after the reaction (for example, an imperfect oxide in a carbon series and water generated at a surrounding of the film) are varied.

A result of the following experiment indicated that, as the substrate temperature was lower, it was necessary to reduce the material gas supply pressure and to decrease the film thickness of deposited $SiO_2$ per cycle. The filling pressure of the material gas is different according to the kinds of gas used. However, the thickness of deposited $SiO_2$ film in a case of the thickness of film formed at one cycle (material gas supply+ozone gas supply) can be adjusted in a range from 0.2 nm ($SiO_2$ one atomic layer) to 1 nm when the substrate temperature is 200° C. and in a range from 0.2 nm ($SiO_2$ one atomic layer) to 5 nm when the substrate temperature is 300° C. In a case where the $SiO_2$ film is deposited in either of the ranges, a good-quality film having a high film density and having a reduced introduction of the carbon-series impurities can be deposited. Thus, in a case where deposited $SiO_2$ film is given at a higher speed, namely, in a case where the material gas pressure is increased, the chemical reaction mainly occurs at the gaseous phase before the material gas arrives at the surface of the substrate, the substrate surface reaction being not found. This is because the material gas present with a relatively high concentration during the deposition on the surface substrate and a reaction by-product such as water generated at the relatively high concentration are taken into the substrate surface.

The details of the experiment result will be described below.

(Method of experiment) The ozone supply partial pressure was fixed to 2700 Pa. In the following experiment, HMDS was used as the material gas. The material gas pressure was varied as 300 Pa, 150 Pa, 50 Pa, and 10 Pa. In a case of substrate temperature of 200° C., it was found that after the repeated depositions with the material gas pressure of 300 Pa, the oxide film become opaque. That is to say, it was found that large quantities of organic materials and reactive intermediate products (imperfect decomposition molecules) were introduced into the oxide film. It means that the decomposition of the material gas through the ozone gas occurs at a location far away from the processed surface. Furthermore, in a case where the oxide film is deposited under the material gas equal to or below 150 Pa, a model supposing that bulk $SiO_2$ optical characteristics (an index of refraction and an extinction coefficient) of the deposited oxide film could be fitted with a high accuracy.

Figure 7:
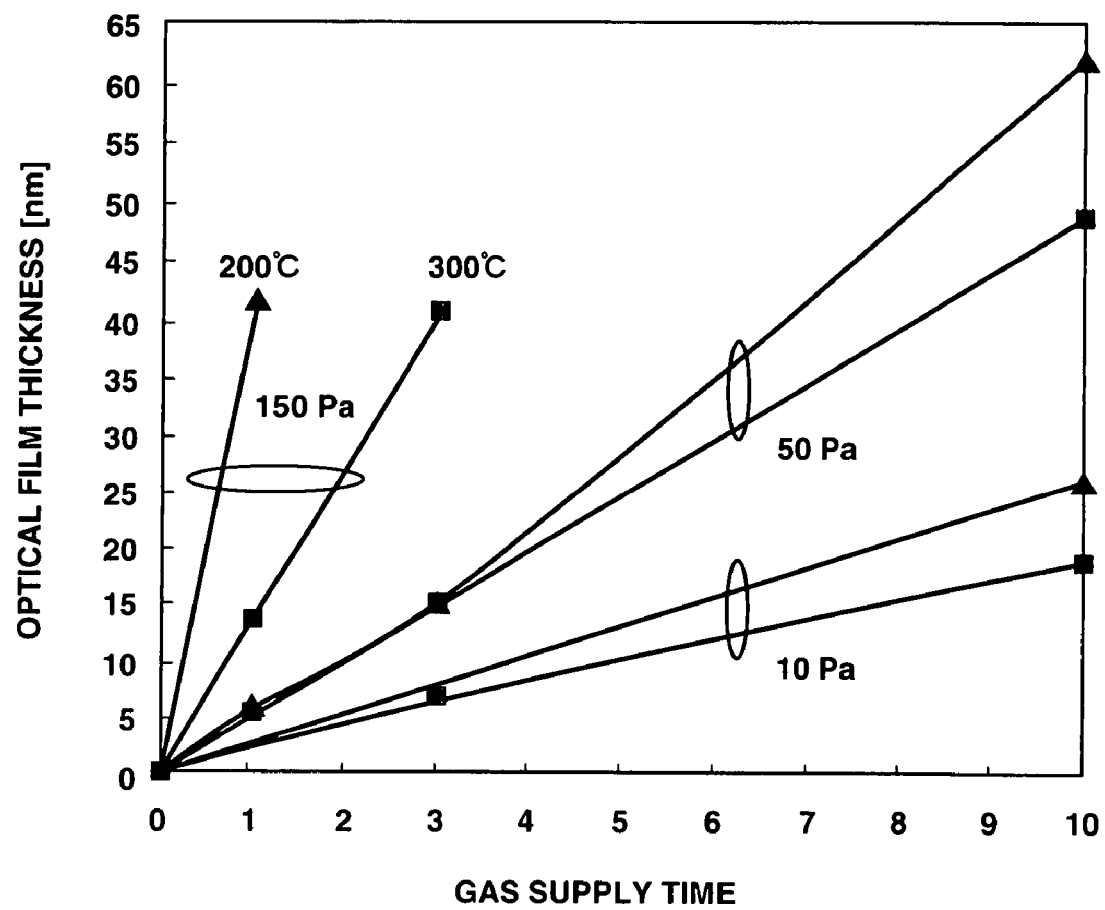
FIG. 7 is a graph representing a characteristic film forming speed.

FIG. 7 shows the result of a search for the film forming speed (an optical film thickness through a spectral ellipsometer) with the substrate temperature, the raw material partial pressure, and alternate supply number of times as parameters. As appreciated from the characteristic graph of FIG. 7, it can be confirmed that together with the increase in the material gas pressure and in proportion to the repeated alternate gas supply number of times, the optical film thickness becomes increased. That is to say, both of the material gas pressure and the repeated alternate gas supply number of times can provide parameters that can control the film forming speed with a high accuracy. In addition, it was indicated that, in the case of the substrate temperature of 200° C., particularly during a high speed film forming in which the material gas pressure is high, the film forming speed was higher than that in the case of the substrate temperature of 300° C.

In addition, when the material gas is modified from HMD in which two Si atoms are included in the molecule to TMS in which one Si atom is included in the molecule, the film forming speed was reduced from 10 nm which is approximately half 18 nm at a ten-cycle supply at the substrate temperature of 300° C. under the material gas pressure of 10 Pa. That is to say, it was confirmed that the film forming speed was varied in proportion to the number of silicon atoms in the material gas.

Next, in order to study compactness of these oxide films, a wet etching speed of the oxide film was investigated. 200:1 buffered hydrofluoric acid was used in the etching process. It was suggested that, as shown in Table 1, as the substrate temperature becomes higher and the material gas pressure becomes lower, the etching speed becomes lower, viz., the oxide film becomes more dense.

Table 1 shows the etching speed of alternate supply deposition film (As-deposition) 200:1 buffered hydrofluoric acid.

TABLE 1

| Substrate temperature (° C.) | 300 | 300 | 300 | 200 | 200 |
|---|---|---|---|---|---|
| Material gas pressure (Pa) | 10 | 50 | 150 | 10 | 50 |
| Etching speed (nm/min) | 37 | 41 | 43 | 50 | 62 |

In addition, it was found that, according to a Fourier transform infrared absorption evaluation as will be described below, as the film is formed at a lower temperature and a growth film thickness per cycle becomes thicker, hydrogen (caused by a water) left in the film becomes increased.

Figure 8:
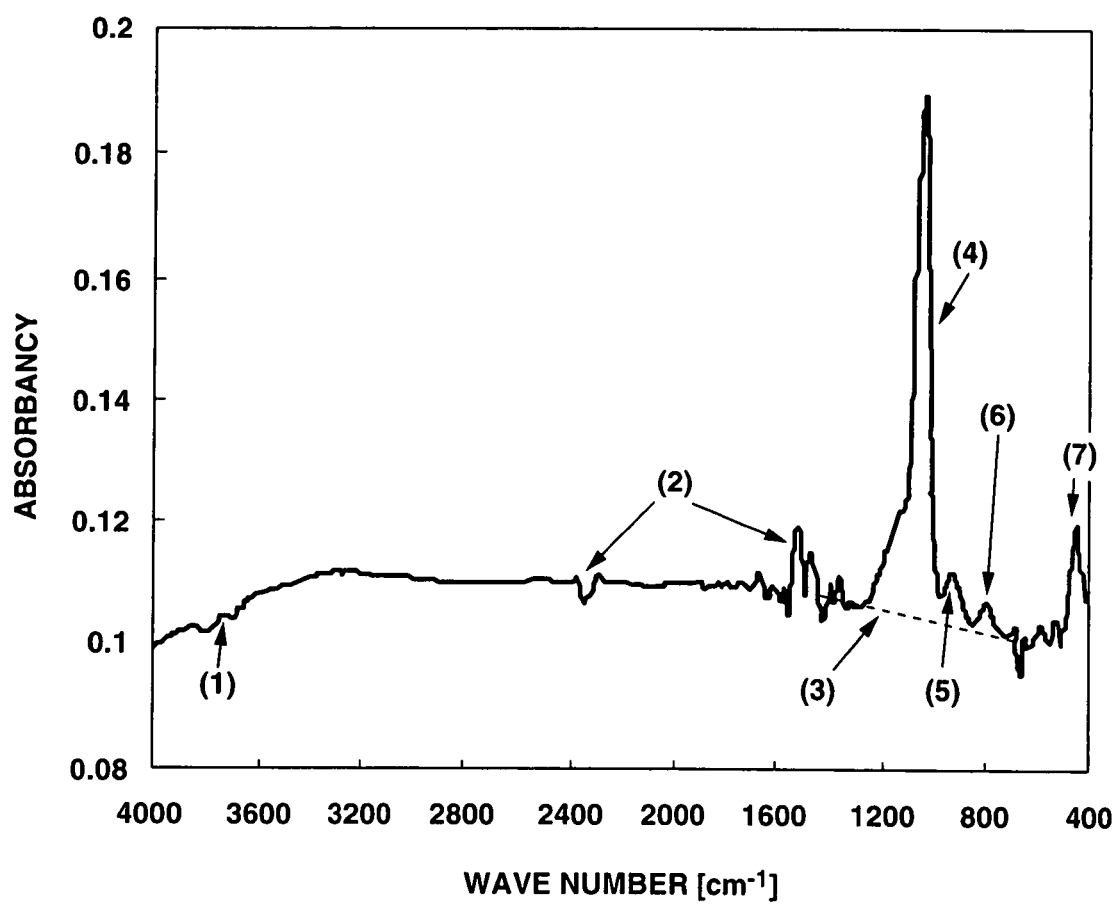
FIG. 8 is a characteristic graph representing a characteristic FTIR spectra.

FIG. 8 shows a characteristic graph representing typical FTIR (Fourier Transform Infrared absorption Spectroscopy) spectra (200° C., 50 Pa, 10 times). In FIG. 8, (1) denotes a feature of Si—OH, (2) denotes features of carbon dioxide gas, a dot line to which (3) is drawn denotes a background, (4) denotes a feature of a stretching of Si—O—Si bond, (5) denotes a feature of Si—OH, (6) denotes a feature of Si—OH deformation, and (7) denotes a feature of Si—OH vibration. In addition, Table 2 shows a peak position of Si—O—Si bond stretching mode under each film forming condition, a half-value width of the peak, and a ratio of signal intensity between Si—OH signal peak and Si—O—Si signal, under each film forming condition. The film thicknesses are, at every sample, aligned to 18 nm in an optical thickness.

In a case where sub oxides within the film are many, variations in a bonding angle of Si—O—Si bond bring out a shift of Si—O—Si peak position toward a low frequency side and an increase in the half-value width.

Table 2 shows Si—O—Si stretching mode peak position, the half-value width, and Si—OH (95 nm)/Si—O—Si peak signal intensity ratio.

TABLE 2

| | Execution examples | | | | | | Comparative example |
|---|---|---|---|---|---|---|---|
| | 1 | 2 | 3 | 4 | 5 | 6 | Thermal oxide film |
| Film forming temperature (° C.) | 300 | 300 | 300 | 200 | 200 | 200 | |
| HMDS raw material Pressure (Pa) | 10 | 50 | 150 | 5 | 10 | 50 | |
| Peak position ($cm^{-1}$) | 1063 | 1065 | 1065 | 1066 | 1067 | 1067 | 1080 |
| Half-value width ($cm^{-1}$) | 75 | 70 | 66 | 75 | 71 | 85 | 75 |
| Si—OH/Si-0-Si signal intensity | 0 | 0.05 | 0.136 | 0.05 | 0.205 | 0.461 | 0 |

Comparative example is obtained in a method for forming the thermal oxide film described in the above background art.

That is to say, under the process at 10 Pa at 300° C. (film forming thickness per cycle: 1 nm), it can be expected that an ideal Si—O—Si bond having a small hydrogen containing quantity in the oxide film has been prepared. Even under the process of 200° C., if the partial pressure of the material gas is reduced and the deposited film thickness per cycle is made lower, the CVD reaction nearer to the substrate surface can be realized and the preparation of the high-quality oxide film can be realized.

Next, a MIS (Metal-Insulator-Semiconductor) structure on which Al (aluminum) electrodes were deposited was prepared and the characteristic as the insulating film was evaluated.

Figure 9:
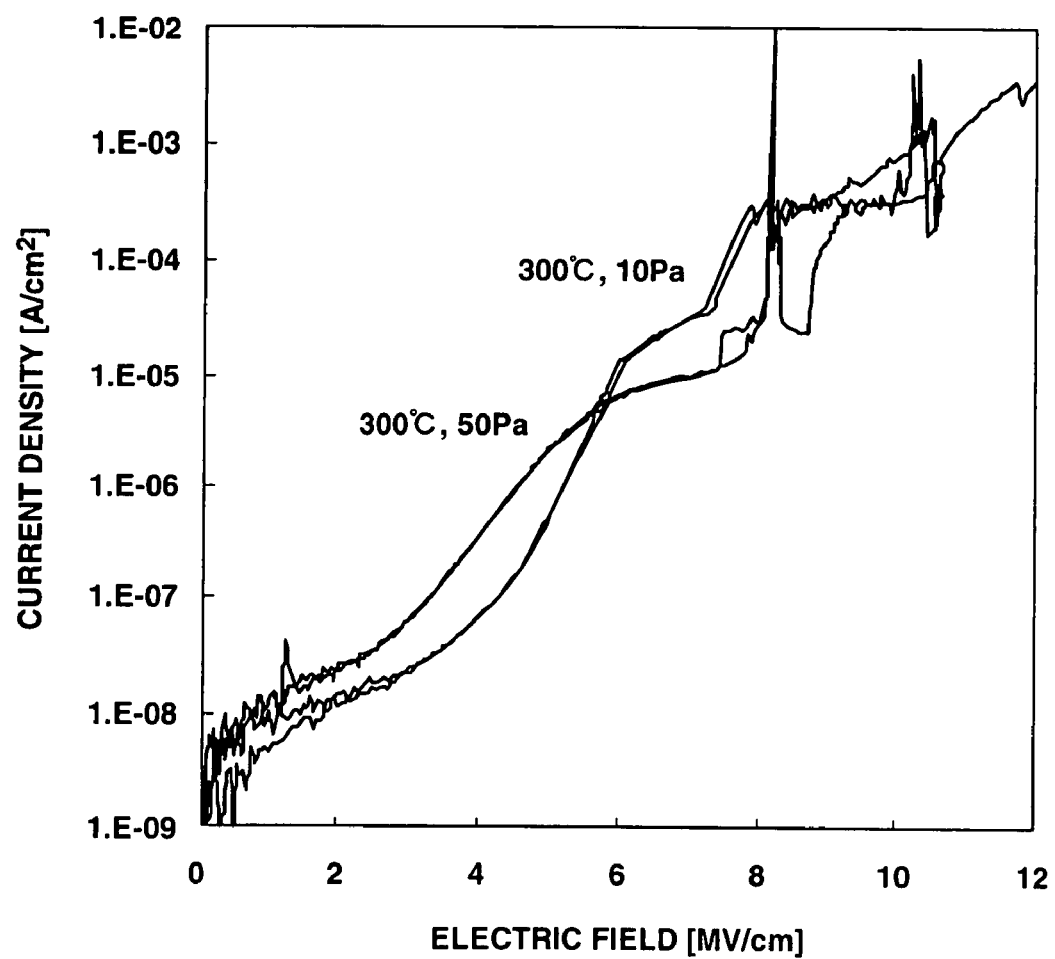
FIG. 9 is a graph representing an electric field strength vs. a leak current density.

FIG. 9 shows a characteristic graph representing an electric field strength dependency applied to a film of a leak current density. The film formed at 300° C. was evaluated through an Iv measurement (the electric field strength dependency applied to the film of the leak current density). It is found that a good-quality oxide film at the film thickness of 1 nm/cycle under the material gas pressure of 10 Pa which was slightly less leak current during an application of a low electric field as compared with the oxide film at the film thickness of 5 nm/cycle under the material gas pressure of 50 Pa can be prepared and, even under both conditions, the oxide film has a sufficient characteristic as the CVD film since a breakdown electric field strength is 8 MV/cm.

Second Embodiment

Figure 10:
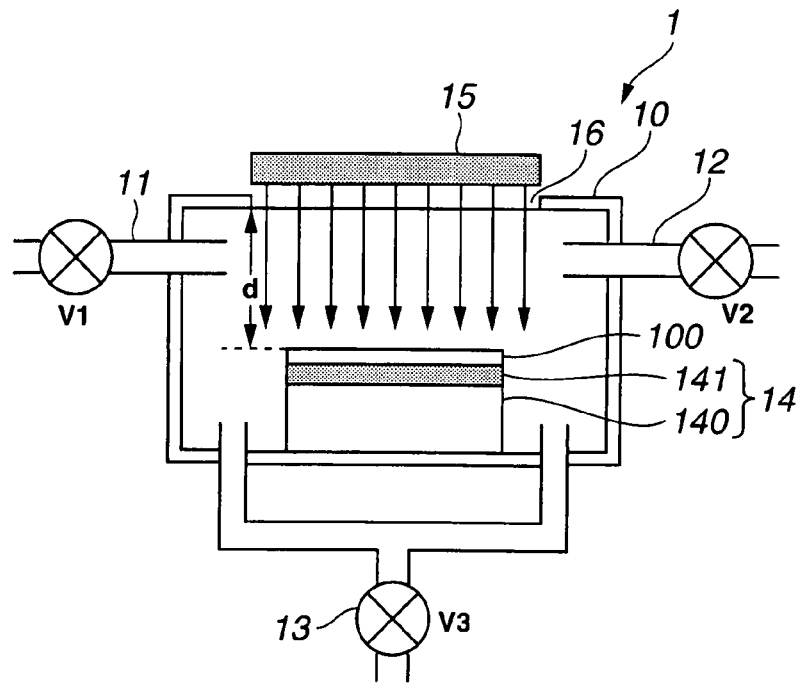
FIG. 10 is a schematic configuration view representing a second preferred embodiment according to the present invention.

FIG. 10 is a schematic configuration view of the oxide film forming equipment in a second preferred embodiment.

The oxide film forming equipment in the second preferred embodiment is provided with a light source 15 to irradiate an ultraviolet (laser) light onto substrate 100 within reactor 10. Therefore, an ultraviolet light introduction window 16 is installed on reactor 10. Ultraviolet light introduction window 16 may be constituted by a known material if the material can transmit the ultraviolet light therethrough. Heater unit 14 can freely adjust the installation position of substrate 100.

A wavelength of the ultraviolet (laser) light corresponds to a wavelength at which an oxygen atom in an excited state is generated due to the irradiation of the light on ozone when an energy of light is equal to or lower than 8.3 eV (Si—O bond energy), the energy of light being larger than a bonding energy (4.8 eV) of O—H bond which is a main component left within the oxide film. As the light source irradiating the ultraviolet (laser) light of this wavelength, a low-pressure mercury lamp (wavelength=185 nm), $Xe_2$ excimer lamp (wavelength=172 nm), or so forth is enumerated.

The above-described structure in this embodiment can establish a condition under which hydrogen left within the silicon oxide film is easy to be desorbed. In addition, it is preferable to make a luminance (an energy density) of the ultraviolet light higher. The higher luminance permits a higher excited state oxygen atom concentration generated due to a result of absorption of the ultraviolet light and permits a diffusion length of the oxygen atom with the oxide film to be longer. That is to say, this is because a depth of reforming (for example, a spatial depth by which Si—C bond and Si—H bond are cut out so as to be enabled to be substituted into Si—O bond to an outside of the film) is increased.

Figure 4:
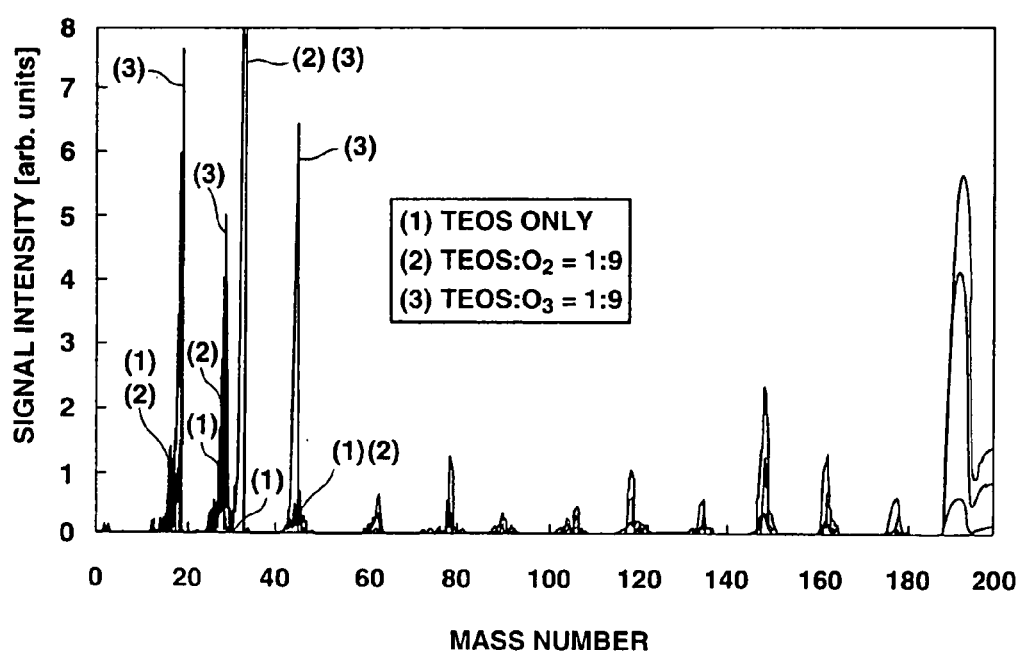
FIG. 4 is a graph of gas composition after ozone gas of 2700 Pa and oxygen gas of 2700 Pa are introduced under TEOS 300 Pa atmosphere.

The irradiation of the ultraviolet (laser) light is only during the ozone containing gas supply (ozone reforming process shown in FIG. 2) but may be during all of time. In details, the irradiation of ultraviolet (laser) light during the supply of the material gas permits C—H bond, Si—C bond, and Si—H bond, each having a low bonding energy from among chemical bonds constituting material gas supply to be previously cut before the supply of ozone gas, even if the material gas absorbs photons. These bonding energies are smaller than 4.8 eV. However, as shown in FIGS. 4 and 5 in the first embodiment, these are almost perfectly decomposed due to an exposure of a sufficient quantity of the ozone containing gas. Hence, the irradiation of the ultraviolet light is not essential.

The irradiation of the ultraviolet (laser) light during the supply of ozone gas permits the film having the equivalent characteristic to the film formed under the same condition as in the case of the first embodiment to be achieved even at a higher-speed deposition. It may be considered that this is because excited state oxygen atoms generated as a result of the ultraviolet light irradiation have high degrees of oxidations as compared with ground state oxygen atoms and have longer diffusion lengths under the silicon material gas atmosphere resided on the substrate surface.

As a restriction of a dimension on the equipment, it is desirable to make a distance d from ultraviolet light introduction window 16 to the surface of substrate 100 shorter than a depth corresponding to a representative absorption depth (the strength of the incident ultraviolet light is 1/e) of the ultraviolet light used in the supply ozone partial pressure. This permits the generation of the excited state oxygen atoms on the substrate surface more efficiently and brings out realizations of the CVD reaction nearer to the substrate surface and of a high-quality oxide film.

An execution example of the oxide film forming equipment in the second embodiment will be described hereinbelow.

In a case where HMDS is used, the irradiation of an ultraviolet pulse laser light (KrF excimer laser, a wavelength: 248 nm, a power density: 200 mJ/cm$^2$, an repetitive frequency: 100 Hz) causes the film to be formed together with HMDS under the condition of distance of 4 cm from the irradiation introduction window to the substrate surface. It was possible to provide a film having a low hydrogen (water) containing percentage and an insulating characteristic which are the same as the explanation as described in the first embodiment up to the growth speed of 2 nm/cycle in a case where the film forming temperature of 200° C. and up to the growth speed of 10 nm/cycle in a case of the film forming temperature of 300° C.

Such a high-speed film forming as described above, viz., an increase in a film thickness formed per cycle brings out a shortage of a process time and an increase in throughput.

Third Embodiment

Figure 11:
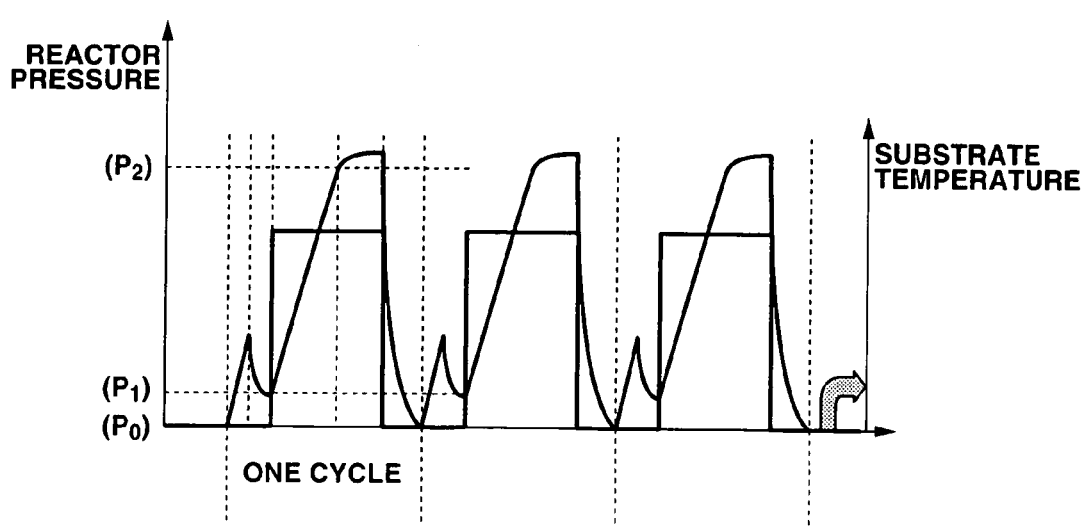
FIG. 11 is a process flow diagram related to a third preferred embodiment according to the present invention.

FIG. 11 shows a process flow related to the oxide film forming equipment in a third preferred embodiment. In FIG. 11, ($P_0$) means an exhaustion arrival pressure (for example, 1 Pa), ($P_1$) means a material gas filling pressure, and ($P_2$) means a pressure after the introduction of ozone. It is noted that one cycle is set to, for example, 1 second through 10 seconds.

The oxide film forming equipment in the third embodiment is, as shown in FIG. 11, during the supply of the material gas, the temperature of substrate 100 is set to a room temperature, and, thereafter, is set to a predetermined temperature (for example, 300° C.) in a pulsative form in accordance with a timing at which ozone gas is supplied.

As described in the experiment result in the first embodiment, it was found that the organic material bonding accompanied with the surrounding of Si such as $CO_2$ and $H_2O$ could be decomposed even at a room temperature due to the reaction in gaseous phase between the material gas and 100% ozone if ozone gas partial pressure provides a sufficient pressure. That is to say, if water (hydrogen) melt in the film during the oxide film reforming can effectively be eliminated and the film is held at a high temperature only during the supply of ozone containing gas, an oxidization power of ozone and the diffusion length of oxygen atoms can be elongated. Thus, a high-quality insulating film can be prepared. In this case, it is desirable to adopt a heating method which can raise or lower the temperature of substrate 100 in an extremely short time. Thus, the temperature within the reactor (system) becomes easy to be set at constant temperature. In addition, the temperature within a spatial distribution of the material gas in the proximity of the surface becomes easy to be constant. As a result of this, a concentration (atomic layer number) of material gas becomes also easy to be constant. Hence, the film thickness of the silicon oxide film brings out a further higher uniformity.

As apparent from the above-described matter, according to the oxide film forming equipment in each of the first, second, and third embodiments, since the ozone containing gas and the material gas are not simultaneously supplied, viz., such a type that the ozone containing gas is introduced toward the material gas present within the reactor and having a very low pressure (a molecular density) (for example, 10 Pa) is adopted, a high-concentration ozone gas (for example, 100% ozone) having an extremely high reactivity to the organic material can be used as oxidizing agent gas without consideration of danger as oxidizing agent.

In addition, since the material gas is spatially uniformly filled and, thereafter, a sufficient quantity of the ozone containing gas to perfectly oxidize the material gas is filled, a high-uniformity process can be achieved even when a large-sized substrate is processed. In a case where a gas flow process is carried out, a fluctuation of a spatial processing that is brought out by the gas flow (due to a spatial fluctuation of molecular densities of the material gas and the ozone gas) cannot be avoided. However, such a problem as described above does not occur in the oxide film forming equipment in each of the first, second, and third embodiments.

Furthermore, the alternate supply method of supplying the material gas and the ozone containing gas in the oxide film forming equipment in each of the first, second, and third embodiments can thicken the deposited films per cycle as compared with the ALD method (a method in which material gas molecules adsorbed on the surface in a self stop manner are reformed by the subsequent gas supply and a thin film of one atomic layer is deposited and this is repeated cyclically) which is one of most important techniques of recent-year thin film high-degree control and large-area deposition methods. Hence, the deposited film per cycle can be thickened. Thus, the number of times the repeated supplies to obtain the constant film thickness of oxide film can be reduced. This brings out the decrease in the film forming time and the increase in throughput. Especially, according to the oxide film forming equipment in the second embodiment, a further faster film forming speed per cycle can be achieved.

In addition, the process time per cycle can be shortened due to the use of ozone as compared with $H_2O$ and so forth often used as the oxidizing agent of the ALD process up to now due to the high reactivity of ozone. That is to say, since ozone which is dry gas is used, a vapor pressure such as water left in the reactor after the reaction is low, gas which is difficult to be exhausted by means of a dry pump is not resided, and the exhaustion becomes fast.

Furthermore, a load on an exhaust system becomes reduced due to an improved utilization efficiency of ozone gas and a small quantity of use thereof. Although a discharge mainly using a high-frequency power supply is used in a manufacture of ozone gas, it is desirable to use ozone gas at minimum requirement in terms of an environment load (an electric power is needed in the manufacture of ozone). The oxide film forming equipment in each of the first, second, and third embodiments satisfies its standpoint.

In addition, since, according to the oxide film forming equipment in the third embodiment, all of the temperatures within the system are constant at the room temperature, uniform concentration distributions (the material gas and the ozone containing gas) become easy to be achieved. Thus, a uniform processing becomes possible. Furthermore, the heating is applied pulsatively. Thus, a high temperature can instantaneously be applied as compared with a continuous heating on the substrate. Consequently, the diffusion distance of ozone cannot only be extended (that is to say, the formed film thickness per cycle can be increased) but also hydrogen which becomes easy to be left in the silicon oxide film and water series impurities can effectively be eliminated.

According to the oxide film forming method and equipment in each of the first, second, and third embodiments, uniform and high-quality insulating films can be prepared, while effectively exerting an organic material decomposition power of high-concentration ozone gas. Consequently, a high-quality insulating film can be prepared even under a low temperature process equal to or lower than 300° C.

In addition, in a case where the substrate is made of a polysilicon series material (for example, polysilicon or amorphous silicon), it is preferable to previously prepare a thermal oxide film in a range from 0.2 nm to 3 nm on the substrate surface before the CVD film deposition with the ozone containing gas previously supplied at a constant flow quantity (for example, 100 sccm) and for a constant time (for example, one minute, the surface temperature being a CVD film forming temperature) before the alternate supplies of CVD material gas and ozone containing gas.

The reason will be described below. It is known that step coverage and adhesion of the CVD film are largely varied according to a surface state being deposited (for example, a difference between hydrophilicity and hydrophobicity, a surface profile, a roughness, and so forth) (reference literature: Yoshie et al. Technical Report (Shingakugiho) of the Institute of Electronics, Information and Communication Engineers of Japan, SDM 94-150 pp. 71 (1994-11)).

For example, in a case where the polysilicon substrate is held under an atmospheric environment, a natural oxidation film (a low film quality) having a thickness in a range from 0.2 nm to 0.6 nm is partially grown. This substrate surface has various crystal-plane-indices polysilicon planes and silicon oxide films. Therefore, this is not desirable as the CVD deposited surface. To achieve depositions having more uniformity and high reproducibility, it becomes important for the state of substrate surface to be controlled.

Thus, it has been confirmed that, when this substrate surface is oxidized by ozone, a high-quality (high-density) silicon oxide film having a more uniformity and higher film thickness density is grown up. That is to say, an ozone thermal oxidation permits the substrate surface state to be controlled more uniformly.

As a thickness of the thermal oxide film, a silicon oxide film having one atomic layer (for example, 0.2 nm) from the standpoint of the control over the surface state may be prepared. From the stand point of the insulating film, it is ideal that the thermal oxide film having the thickness of 3 nm by which a direct tunneling current does not flow previously grown up on an ozone thermal oxide film in order to function as an interface buffer layer (which achieves an improvement in the adhesion between the CVD film and the substrate). With these points taken into consideration, it is preferable to prepare the thermal oxide film in a range from 0.2 nm to 3 nm. It is, however, noted that, since the processing time becomes long and the throughput is reduced in order to grow up the thermal oxide film of 3 nm, actually, the film may preferably be processed under the condition of the substrate temperature of 300° C., 1 atmospheric pressure, and 10 vol % ozone gas for an effective processing time (about ten minutes). Consequently, the thermal oxide film having the thickness in a range from about 1 nm to 2 nm can be formed.

Furthermore, when the thermal oxide film is formed, the ultraviolet light is irradiated on the substrate, a better-quality thermal oxide film can be formed having a sufficient film thickness (for example, 3 nm) even at a low temperature (for example, the room temperature) in a short time. In this case, since the preferable thermal oxide film can be formed at the low temperature such as the room temperature, the heating of the substrate can become unnecessary. As the ultraviolet light to be irradiated, the low-pressure mercury lamp (wavelength=185 nm) or $Xe_2$ excimer lamp (wavelength=172 nm), each having the light energy equal to or lower than 8.3 eV and the gross energy layer larger than 4.8 eV can be used.

Fourth Embodiment

In addition, the material gas containing an organic metal and the ozone containing gas may alternately be supplied to the substrate not only at the time of preparation of the silicon oxide film but also at the time of preparation of a metal oxide film. At this time, the oxide film forming equipment in this embodiment may adopt the same structure as the oxide film forming equipment described in each of the first, second, and third embodiments.

An application of the metal oxide film is wide as an LSI (capacitor) purpose gate insulating film, a ferroelectric substance film, a TFT (Thin Film Transistor) purpose gate insulating film, and a transparent conducting film. Thicknesses of these films approximately range from about 1 nm to about 100 nm. The ALD (Atomic Layer Deposition), the CVD (Chemical Vapor Deposition: sputtering and so forth), and a Pulsed Laser Deposition have been used properly in accordance with their film thicknesses and film qualities. Regarding the film, to provide the metal oxide film (including $SiO_2$ films) (a film having a small mismatch of a lattice constant to the substrate is, for example, prepared on the interface to make the adhesion between the film and the substrate higher), there are increased demands of a film having a plurality of compositions of an arbitrary film thickness in a depth direction, for example, a laminated film of $Ta_2O_5$ (ditantalum pentaoxide) and $SiO_2$ (silicon dioxide) or a film whose compositions of x, y, and z of Sr $(strontium)_x$Ba $(barium)_y$O$(oxygen)_z$ are changed in the depth direction.

The ALD (Atomic layer Deposition) is a method for forming the film by supplying cyclically a reactor on the substrate. A cyclic supply of the material gas and oxidizing gas causes a functional group on the substrate surface to be replaced by means of a chemical reaction and the film formation is advanced with a control for each atomic layer. A film having a high film density and having a stoichiometric composition is easily obtained. It is, however, noted that, since the growth is rate controlled due to an absorption of the material gas, there is a problem that the throughput (the film forming speed) is reduced.

On the other hand, an MOCVD (Metal Organic CVD) method especially most widely used as the CVD method is a method in which organic metal gas and oxidizing gas are supplied so as to be caused to flow on the substrate surface in a gaseous form and a metal oxide which is a residue due to the chemical reaction of both of the gases is deposited. A conformal film formation having a large throughput and small convexes and recesses can be achieved. However, a problem such that impurities such as carbon, hydrogen, and so forth are easy to be left on the metal oxide film is raised.

Although a low throughput of the ALD is improved by shortening the reaction time required (for a replacement of a surface terminal group) by a use of gas such as ozone having a high reactivity in place of a generally used water or oxygen molecule as the oxidizing agent, the deposition for each one atomic layer is carried out. Thus, it is difficult to make a remarkable improvement. In order to realize an impurity removal in the MOCVD method, a method in which ozone having a high organic material decomposition is used can be considered. However, it is difficult to perform a uniform processing of the film quality and film thickness in a case where high-concentration ozone gas (equal to or higher than several ppm) is used in the MOCVD method. It can be considered that, due to a high decomposition power of ozone gas of a high concentration, a spatial dependency in the CVD reaction is generated due to a difference in ozone concentration between a gas upstream side thereof and a downstream side thereof. However, in a case where ozone gas having a low concentration equal to or lower than several hundred ppm is used, the uniform processing can be realized.

The alternate supply of the high-concentration ozone gas under a low pressure state in the fourth embodiment solves a low throughput of the ALD method, a low compatibility between the MOCVD of a gas flow type and the high-concentration ozone gas, and a low removal capability of carbon-series impurities in the MOCVD method.

It is known that a diffusion distance of oxygen atom in a metal or in the metal oxide film, each of which is prepared by the sputtering or the pulsed laser deposition, is different depending upon a kind of metal but ranges from 10 nm to 20 nm (for example, refer to a Japanese Publication Patent Application (tokkai) No. 2004-137). It is a delicate matter that the growth equal to or lower than one atomic layer by the ALD sufficiently utilizes an oxidizing power (a diffusion power) of ozone. That is to say, if the ozone concentration on the substrate surface after the reaction of organic material gas is sufficiently high, the oxide film without an imperfect oxidization layer is formed even when the metal oxide film having, at maximum, about 10 nm per pulse is deposited. The film forming speed per pulse described in the first embodiment is, at an optimum condition, 0.2 nm per pulse through 5 nm per pulse in the case of $SiO_2$ having a covalent bond and whose oxygen atoms are difficult to be diffused and in the case of the film forming temperature of 300° C. In the case where oxygen atoms in the metal oxide film can be diffused more extensively and the preparation of a thicker film at a higher speed is demanded, a limitation is not placed on the above condition. It is noted that, as gas pressure becomes higher, the CVD reaction in this technique occurs at a location remote from the substrate surface. Even in the technique in which ununiform gas flow is not generated, the result is that the film thickness and the film quality are varied on the basis of a function of a distance from an ozone gas injection outlet to the film. Therefore, with the uniform processing of the large-sized substrate taken into consideration, the above-described condition may actually be preferable.

In addition, as compared with the MOCVD method, since the atmosphere is in the low pressure state without use of carrier gas and ununiform gas flow does not occur, the thermal decomposition hardly occurs even at the high-concentration ozone gas, a life is long, and a macroscopic gas flow does not occur. Hence, the distributions of the film thickness and the film quality become difficult to occur. Furthermore, even in the case of preparation of the oxide film in a layer structure such that the change in the composition of the oxide film occurs in the depth direction and even in a case where the respective film thicknesses are strictly controlled, pressure adjustments of both of the material gas and the ozone containing gas and a switching of the material gas for each phase can cope with these cases. In addition, since gas generated according to the reaction is perfectly exhausted after each pulse, there is a merit of no mutual interference between the pulses. On the other hand, in the case of MOCVD method, in order to hold the uniformity of the processing (not to generate a situation of a gas exhaustion), it is a general practice that the concentration of the material gas at the downstream side of the reactor is set to 99.9 volume % or higher. However, this reduces a gas utilization efficiency and imposes a load on the exhaust system.

As material gas required to prepare the metal oxide film, gas containing an organic metal having a metal element-oxygen bond or a metal element-carbon bond is enumerated. For example, the organic metal material gas used in the ALD method, MOCVD method, and so forth may be adopted. More specifically, in a case where the oxide film made of $TiO_2$ (titanium dioxide) is formed, TTIP (titaniumtetraisopropoxide), TPT (tetraisopropyltitanate), and so forth is enumerated. In a case where the oxide film made of $Al_2O_3$ (aluminum oxide) is formed, $Al(CH_3)_3$ (trimethylaluminum) and so forth is enumerated. Furthermore, in a case where the oxide film made of $HfO_2$ (hafnium dioxide) is formed, $Hf(OC_4H_9)$ and so forth is enumerated.

Then, in the same way as each of the embodiments described hereinbefore, the alternate supply of the organic metal material gas with the high-concentration (100%) ozone gas permits all ruptures of the bonds between the metal element and C (carbon), a side-chain C—H, and other organic bonds and permits a reduction of the left organic material in the film which has been imperfect in the ALD and MOCVD methods in which conventional oxygen and water are used as the oxidizing agent. It is noted that since, from among bonding masters of HMDS, a bonding energy of C—H bond is 4.3 eV, perfect bond ruptures and perfect oxidations can be realized if an atom (for example, C, H, N, or O) bound with a metal atom has the bonding energy equal to or lower than this value.

In addition, in a case where the vapor pressure is low during the preparation of the metal oxide film, a well known vaporizer which is used for the introduction of CVD material gas may be used in the same way as the conventional ALD and MOCVD methods. All of metals such that the organic metal material gas having a stable vapor pressure is present permit the preparation of metal oxides. In this case, the ozone gas pressure supplied to respective metals or the ozone partial pressure during the perfect ozone gas introduction may be introduced by a pressure corresponding to a quantity required to have the material gas perfectly oxidized in the stoichiometric form (metal oxide+$CO_2$+$H_2O$+($NO_2$: in a case where N atom is included) in the same way as the case of $SiO_2$.

As the metal oxide film generated in this embodiment, $Al_2O_3$ (aluminum oxide film), $Zr_2O_5$ (zirconium oxide film), $HfO_2$ (hafnium oxide film), $Ta_2O_3$ (tantalum oxide film), $TiO_2$ (titanium oxide film), ZnO (zinc oxide film), and so forth are enumerated.

In addition, in a case where, in this embodiment, the substrate is made of a polysilicon-series material (for example, a polysilicon or amorphous silicon) in the same way as the third embodiment, the ozone containing gas is previously supplied to the substrate in the reactor at a constant flow quantity (for example, 100 sccm) for a constant time (for example, one minute and the substrate temperature is the CVD film forming temperature) to previously form the thermal oxide film in a range from 0.2 nm to 3 nm on the substrate surface before the metal oxide film deposition before the alternate supplies of the material gas and the ozone containing gas.

According to the oxide film forming method in this embodiment, in the same way as each of the first, second, and third embodiments, the film formation having improved utilization efficiency and high throughputs can be realized. In addition, as compared with the ALD, unnecessary gas in the gaseous phase is exhausted by an air purge in place of a gas purge. The reaction time is shortened. Furthermore, as compared with the MOCVD, ununiform gas flow becomes difficult to occur. Therefore, in the conventional process using ozone gas, due to the difference in the ozone concentrations at the gas upstream side of the high-temperature substrate surface and at the gas downstream side thereof, it has been difficult to secure the uniformity of both film quality and film thickness. However, since, according to the oxide film forming method described in each of the embodiments, the alternate supplies of the material gas and the ozone containing gas are carried out in the low pressure state. Hence, although the ozone gas concentration is high, the thermal decomposition hardly occurs, the life is long, the macroscopic gas flow becomes difficult to occur, and the distributions of the film thickness and the film quality become difficult to occur.

Hence, the preparation of the uniform and high-quality oxide film is achieved.

The invention claimed is:

1. An oxide film forming method comprising:
   (a) supplying alternately a material gas containing an organic silicon having a Si (silicon)-O (oxygen) bond or a Si (silicon)-C (carbon) bond or an organic metal having a metal element-oxygen bond or a metal element-carbon bond and an ozone containing gas to a substrate to form an oxide film on a surface of the substrate,
   wherein when one silicon atom is included in the material gas, an introduction pressure of the material gas at a cycle of supplying alternately the material gas and the ozone containing gas is in a range from 0.1 Pa to 100 Pa, and wherein where a number n of silicon atoms are included in the material gas, the introduction pressure of the material gas at a cycle of supplying alternately the material gas and the ozone containing gas is in 1/n of said range of the case where one silicon atom is included in the material gas;
   (b) adjusting a temperature of the substrate in a range from a room temperature to 400° C.; and
   (c) adjusting a concentration of ozone of the ozone containing gas in a range from 0.1 vol % to 100 vol %.

2. The oxide film forming method as claimed in claim 1, wherein the ozone containing gas to the material gas is supplied by a quantity corresponding to a chemical equivalent to oxidize the organic silicon or the organic metal at least included in the material gas all to a silicon oxide or a metal oxide.

3. The oxide film forming method as claimed in claim 2, wherein a supply quantity of the ozone containing gas is set to a quantity to a degree that a pressure rise due to a thermal decomposition of ozone resided in a closed reaction system among the substrate, the material gas, and the ozone containing gas after the ozone containing gas is supplied is confirmable.

4. The oxide film forming method as claimed in claim 1, wherein, in each cycle of supplying alternately the material gas and the ozone containing gas, a film forming speed per cycle becomes lower as the temperature of the substrate becomes lower.

5. The oxide film forming method as claimed in claim 4, wherein the film forming speed is in a range from 0.2 nm/cycle to 1.0 nm/cycle at the temperature of the substrate of 200° C.

6. The oxide film forming method as claimed in claim 4, wherein the film forming speed is in a range from 0.2 nm/cycle to 5.0 nm/cycle at the temperature of the substrate of 300° C.

7. The oxide film forming method as claimed in claim 1, wherein, when the material gas and the ozone containing gas are alternately supplied to the substrate, an ultraviolet light is irradiated on the substrate.

8. The oxide film forming method as claimed in claim 7, wherein a reactor in which the material gas and the ozone containing gas are alternately supplied to form the oxide film on the surface of the substrate while irradiating an ultraviolet light on the substrate is provided and a distance from an ultraviolet light irradiation window installed on the reactor to the substrate is adjusted to be shorter than an absorption depth of the introduced ultraviolet light absorbed by an ozone partial pressure.

9. The oxide film forming method as claimed in claim 1, wherein the reactor is of a low pressure cold wall type or a hot wall type.

10. The oxide film forming method as claimed in claim 1, wherein, in a case where the substrate is made of a polysilicon series material, the ozone containing gas is supplied to the substrate at a constant flow quantity for a constant time under a constant temperature of the substrate to form a thermal oxide film on the substrate before supplying alternately the material gas and the ozone containing gas to the substrate.

11. The oxide film forming method as claimed in claim 10, wherein, when forming the thermal oxide film, the ultraviolet light is irradiated on the substrate.

* * * * *

UNITED STATES PATENT AND TRADEMARK OFFICE
CERTIFICATE OF CORRECTION

PATENT NO. : 7,772,133 B2
APPLICATION NO. : 11/659728
DATED : August 10, 2010
INVENTOR(S) : Tetsuya Nishiguchi et al.

It is certified that error appears in the above-identified patent and that said Letters Patent is hereby corrected as shown below:

On the Title Page:
Item (73) Assignee, after "Meidensha Corporation, Tokyo (JP)" please insert
-- and National Institute of Advanced Industrial Science and Technology, Tokyo (JP) --.

Signed and Sealed this
Twenty-fifth Day of January, 2011

David J. Kappos
*Director of the United States Patent and Trademark Office*